US012719423B2

(12) United States Patent
Patel et al.

(10) Patent No.: US 12,719,423 B2
(45) Date of Patent: Aug. 25, 2026

(54) PSEUDO BI-DIRECTIONAL AMPLIFIER

(71) Applicant: QUALCOMM INCORPORATED, San Diego, CA (US)

(72) Inventors: Chirag Dipak Patel, San Diego, CA (US); Chinmaya Mishra, San Diego, CA (US); Cheng Tao, San Diego, CA (US); Muhammad Hassan, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 359 days.

(21) Appl. No.: 18/470,091

(22) Filed: Sep. 19, 2023

(65) Prior Publication Data

US 2025/0096752 A1 Mar. 20, 2025

(51) Int. Cl.
*H03F 3/24* (2006.01)
*H04B 1/40* (2015.01)

(52) U.S. Cl.
CPC ............... *H03F 3/245* (2013.01); *H04B 1/40* (2013.01); *H03F 2200/165* (2013.01); *H03F 2200/171* (2013.01); *H03F 2200/294* (2013.01); *H03F 2200/451* (2013.01)

(58) Field of Classification Search
CPC .................................. H03F 3/245; H04B 1/40
See application file for complete search history.

(56) References Cited

U.S. PATENT DOCUMENTS 8,279,018 B1 10/2012 Song et al.
2005/0134387 A1 6/2005 Rofougaran
2012/0295559 A1 11/2012 Kwok et al.
2013/0267185 A1* 10/2013 Chen ........................ H04B 1/44 455/78
2017/0244442 A1 8/2017 Mizokami et al.
2018/0226367 A1* 8/2018 Babcock ............... H03F 1/3205
2021/0194565 A1* 6/2021 Paramesh ............ H04B 7/0617
2022/0021365 A1* 1/2022 Vigilante ............. H03H 7/1708

(Continued)

FOREIGN PATENT DOCUMENTS

WO 2023043587 A1 3/2023

OTHER PUBLICATIONS

Chiu T-Y., et al., "A Ka-Band Transformer-Based Switchless Bidirectional PA-LNA in 90-nm CMOS Process", 2021 IEEE MTT-S International Microwave Symposium (IMS), [Online], Jun. 7, 2021, pp. 450-453, XP093221795, p. 450, left-hand col. line 21-p. 452, right-hand col. line 19, figures 1-8.

(Continued)

*Primary Examiner* — David Bilodeau
(74) *Attorney, Agent, or Firm* — Smith Tempel Blaha LLC/Qualcomm

(57) ABSTRACT

A radio frequency integrated circuit (RFIC), including a power amplifier (PA) connected to an antenna through a first electromagnetic (EM) element, the PA configured to receive a transmit signal from a second EM element, a low noise amplifier (LNA) connected to the first EM element and the second EM element, the power amplifier and the LNA comprising separate amplifier cores, and wherein the first EM element comprises a first plurality of interwound windings occupying a first common area and the second EM element comprises a second plurality of interwound windings occupying a second common area.

25 Claims, 14 Drawing Sheets

(56) References Cited

U.S. PATENT DOCUMENTS

| | | | | |
|---|---|---|---|---|
| 2022/0052656 | A1* | 2/2022 | Ryu | H03F 1/302 |
| 2024/0380566 | A1* | 11/2024 | Hsiao | H03F 3/245 |
| 2024/0405424 | A1* | 12/2024 | Wu | H03F 3/45 |

OTHER PUBLICATIONS

International Search Report and Written Opinion—PCT/US2024/042852—ISA/EPO—Nov. 26, 2024.

Li Y., et al., "A 32.2-38.2 GHz Broadband 4-Channel TRx Beamformer with Embedded 3-Winding Transformer Based PA/LNA FE and High Resolution Phase/Amplitude Control", 2022 IEEE Asian Solid-State Circuits Conference (A-SSCC), IEEE, Nov. 6, 2022, pp. 14-15, XP034251540, p. 14, left-hand col. line 12-right-hand col. line 34, figures 1-6.

Zhang J., et al., "An Ultra-compact Bidirectional Ka-Band Front-End Module with 4.0-dB NF and 13.5-dBm OP1dB", 2022 IEEE International Symposium on Radio-Frequency Integration Technology (RFIT), IEEE, Aug. 29, 2022, pp. 24-26, XP034186287, p. 24, left-hand col. line 9-p. 26, right-hand col. line 5, figures 1-7.

* cited by examiner

600

PSEUDO BI-DIRECTIONAL AMPLIFIER

FIELD

The present disclosure relates generally to electronics, and more specifically to amplifiers in a transceiver.

BACKGROUND

Wireless communication devices and technologies are becoming ever more prevalent as are communication systems that operate at millimeter-wave (mmW) and at near-mmW frequencies. A 5G mmW communication system may be implemented that generally uses a time domain duplex (TDD) communication methodology. For a TDD system, such as that used in 5G-mmW implementations, transmit (Tx) and receive (Rx) (Tx/Rx) chains do not operate simultaneously, creating an opportunity to share resources between them.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a radio frequency integrated circuit (RFIC), including a power amplifier (PA) having an output coupled to an antenna through a first electromagnetic (EM) element, the PA configured to receive at an input a transmit signal from a second EM element, a low noise amplifier (LNA) having an input coupled to the first EM element and an output coupled to the second EM element, the power amplifier and the LNA comprising separate amplifier cores, and wherein the first EM element comprises a first plurality of windings occupying a first common area and the second EM element comprises a second plurality of windings occupying a second common area.

Another aspect of the disclosure provides a method for amplifying signals, including coupling an output of a power amplifier (PA) and an input of a low noise amplifier (LNA) to an antenna through a first electromagnetic (EM) element, and coupling an input of the PA to a transmit signal and an output of the LNA to a receiver through a second EM element, and wherein the first EM element comprises a first plurality of windings occupying a first common area and the second EM element comprises a second plurality of windings occupying a second common area.

Another aspect of the disclosure provides a device for amplifying signals, including means for coupling an output of a power amplifier (PA) and an input of a low noise amplifier (LNA) to an antenna through a first electromagnetic (EM) element, and means for coupling an input of the PA to a transmit signal and an output of the LNA to a receiver through a second EM element, and wherein the first EM element comprises a first plurality of windings occupying a first common area and the second EM element comprises a second plurality of windings occupying a second common area.

Another aspect of the disclosure provides a communication system having a pseudo bi-directional amplifier, including a transmitter and a receiver, a power amplifier connected to an antenna through a first electromagnetic (EM) element, the PA configured to receive a transmit signal from a second EM element, a low noise amplifier (LNA) connected to the first EM element and the second EM element, the power amplifier and the LNA comprising separate amplifier cores, and wherein the first EM element comprises a first plurality of interwound windings having a first efficient coupling factor and occupying a first common area and the second EM element comprises a second plurality of interwound windings having a second efficient coupling factor and occupying a second common area.

Another aspect of the disclosure provides a communication system having a pseudo bi-directional amplifier, including a first electromagnetic (EM) element, a second EM element, and a power amplifier and a low noise amplifier (LNA) each disposed at least partially between the first EM element and the second EM element. The PA is spaced from the LNA. The PA is coupled to an antenna through the first EM element and is configured to receive a transmit signal from the second EM element. An input of the LNA is coupled to the first EM element and an output of the LNA is coupled to the second EM element. The first EM element comprises a first plurality of at least partially overlapping windings and the second EM element comprises a second plurality of at least partially overlapping windings.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In accordance with an exemplary embodiment, a pseudo bi-directional amplifier comprises an electromagnetic (EM) element with a shared area at an input to a power amplifier (PA) and at an output of a low noise amplifier (LNA), and comprises an electromagnetic (EM) element with a shared area at an output of a power amplifier (PA) and at an input to a low noise amplifier (LNA).

In accordance with an exemplary embodiment, the windings that comprise each EM element may be interwound, thus significantly reducing an amount of area consumed on an integrated circuit by the EM elements.

In accordance with an exemplary embodiment, the LNA and the PA that are connected to the EM elements may be located on an integrated circuit between the EM elements, thus further reducing an amount of area consumed on an integrated circuit by the EM elements and by the PA and LNA.

In an exemplary embodiment, the term "pseudo bi-directional" refers to a transceiver architecture where the transmitting amplifier (PA) and receiving amplifier (LNA) are located on the same integrated circuit but do not operate simultaneously. Instead, the EM elements with shared area allow the transmitting amplifier (PA) and receiving amplifier (LNA) to be disposed proximate one another and share the same antenna and potentially upconversion/downconversion and/or phase shift circuitry.

For example, portions of the EM elements may overlap and define an area therebetween in which the PA and LNA may be disposed. Thus, signals may appear to be input to a common or shared area and output from a common or shared area (creating the appearance of that area being "bidirectional") while the PA and LNA (e.g., cores thereof or signal paths therethrough) are maintained separate. The respective amplifiers can be configured or optimized differently (and be of different size) to ensure good performance while area is reduced.

Figure 1:
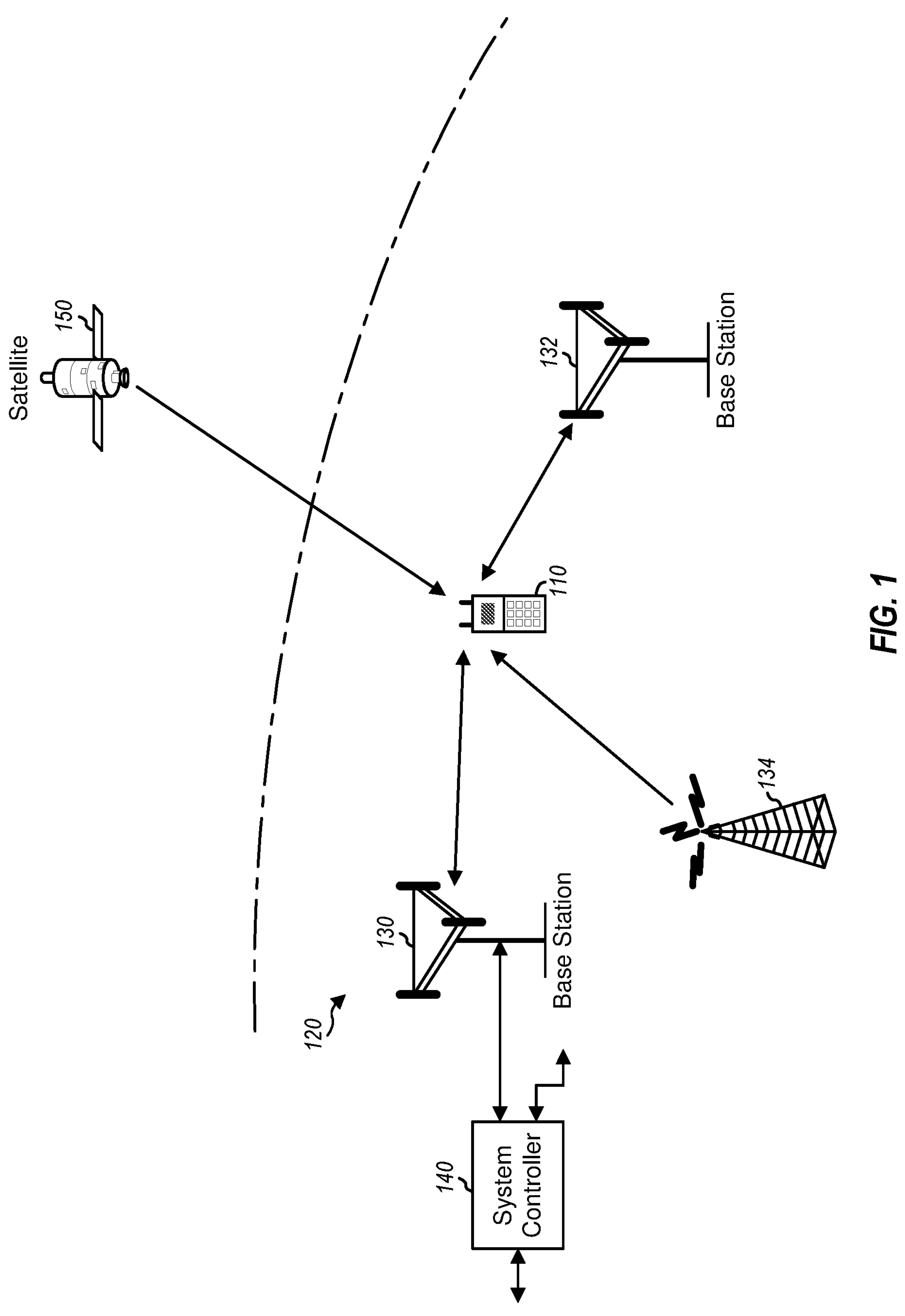
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or may communicate with satellites (e.g., a satellite 150 in one or more global navigation satellite systems (GNSS), or a satellite that can receive signals from the wireless device 110, etc.). Wireless device 110 may support one or more radio technologies for wireless communication such as LTE, WCDMA, CDMA 1×, EVDO, TD-SCDMA, GSM, 802.11, 802.15, 5G, Sub6 5G, 6G, UWB, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types-intra-band CA and inter-band CA. Intra-band CA refers to operation on multiple carriers within the same band. Inter-band CA refers to operation on multiple carriers in different bands.

Figure 2A:
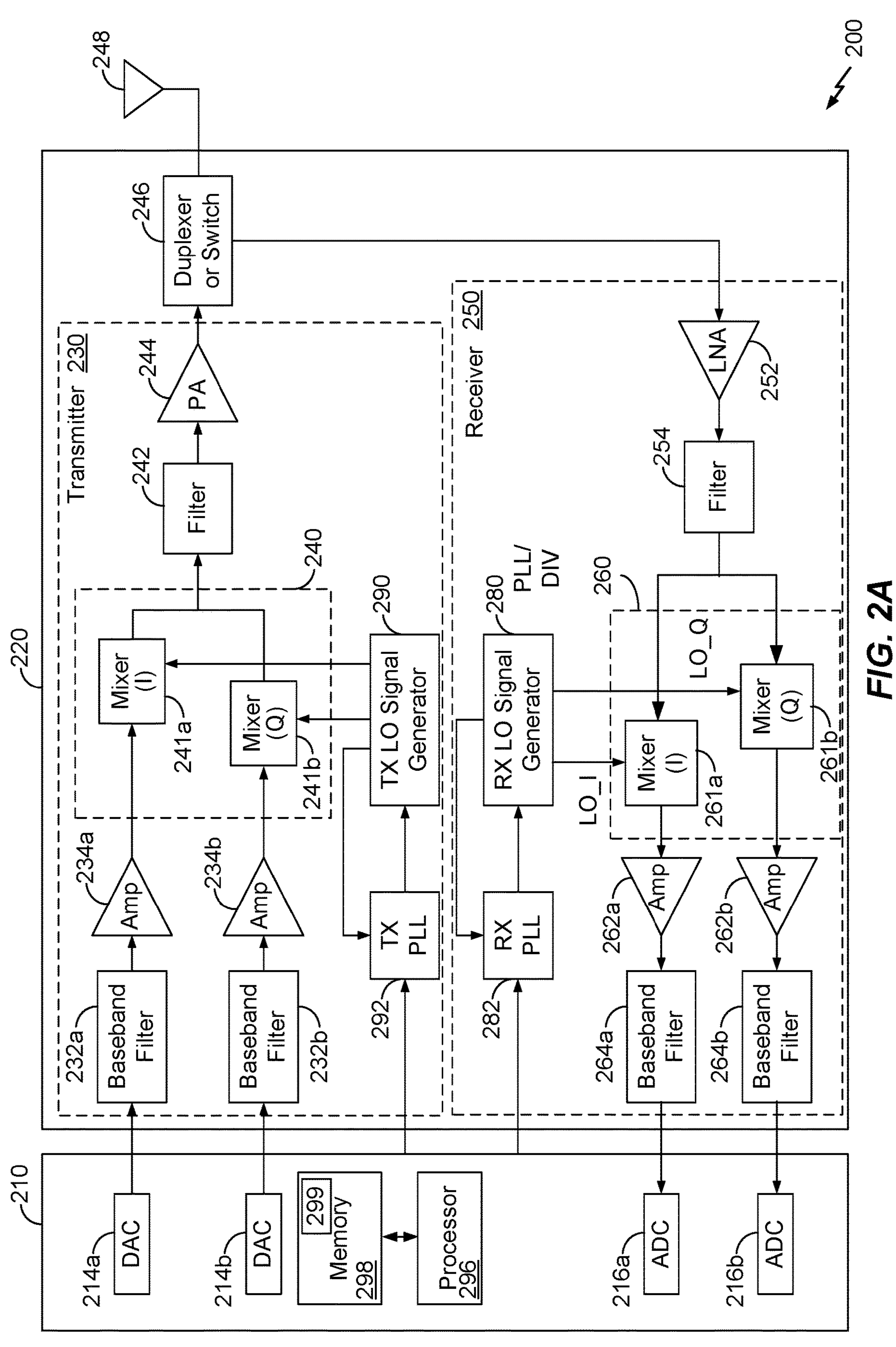
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the pseudo bi-directional amplifier described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220 digitally.

Within the transmitter 230, baseband (e.g., lowpass) filters 232*a* and 232*b* filter the I and Q analog transmit signals, respectively, to remove undesired images caused by the prior digital-to-analog conversion. Amplifiers (Amp) 234*a* and 234*b* amplify the signals from baseband filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal.

Downconversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by baseband (e.g., low-pass) filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
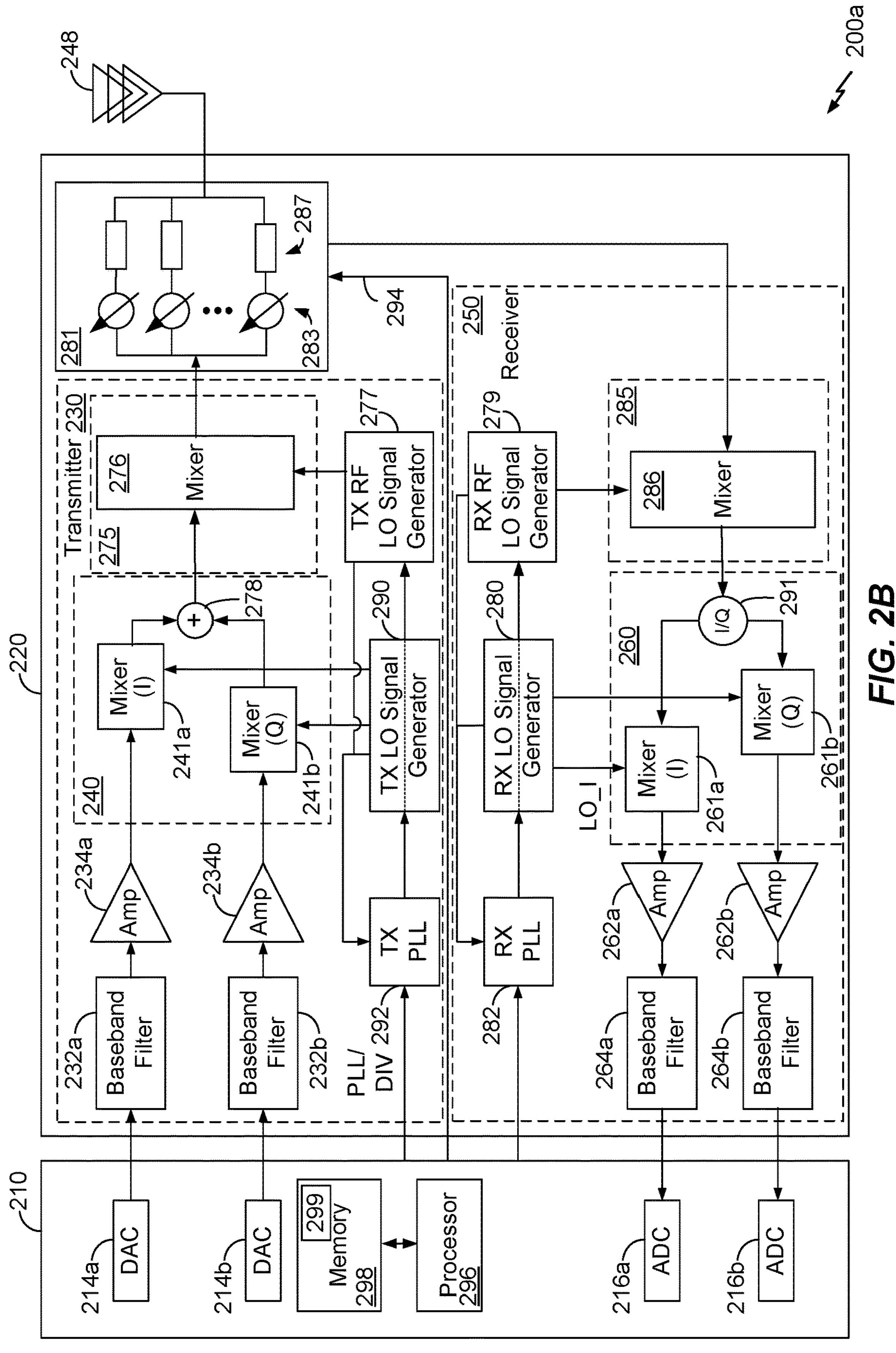
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200*a* in FIG. 2B may be configured similarly to those in the wireless device 200 shown in FIG. 2A and the description of identically numbered items in FIG. 2B will not be repeated.

The wireless device 200*a* is an example of a heterodyne (or superheterodyne) architecture in which the upconverter 240 and the downconverter 260 are configured to process a communication signal between baseband and an intermediate frequency (IF). The IF signal may be a low IF (LIF) signal, or a zero (or near zero) IF (ZIF) signal. For example, the upconverter 240 may include a summing function 278 and may be configured to provide an IF signal to an upconverter 275. In an exemplary embodiment, the upconverter 275 may comprise upconversion mixer 276. The summing function 278 combines the I and the Q outputs of the upconverter 240 and provides a non-quadrature signal to the upconversion mixer 276. The non-quadrature signal may be single ended or differential. The upconversion mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287. For example, one or two arrays of four or five antennas and corresponding phase shifters/phased array elements may be implemented.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, respective phase shifters 283 may be incorporated within respective phased array elements 287 where each phased array element 287 will include a respective phase shifter 283.

The phase shift circuitry 281 is coupled to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a downconversion mixer 286. In an exemplary embodiment, the mixer 286 downconverts the receive RF signal provided by the phase shift circuitry 281 to an IF signal according to RX RF LO signals provided by an RX RF LO signal generator 279. The downconverter 260 includes an I/Q generation function 291. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 2C:
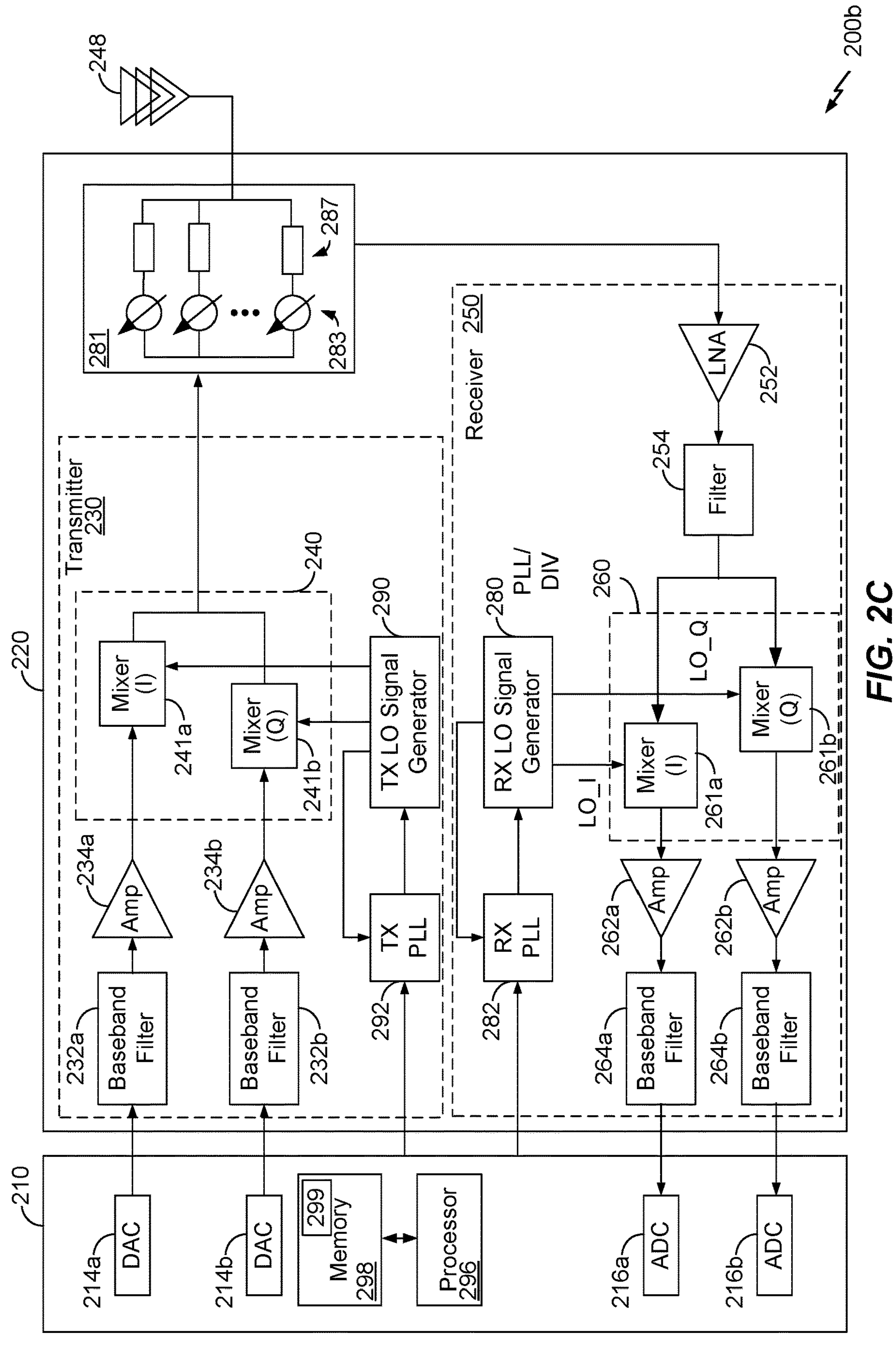
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200*b* in FIG. 2C may be configured similarly to those in the wireless device 200 shown in FIG. 2A and/or the wireless device 200*a* shown in FIG. 2B and the description of identically numbered items in FIG. 2C will not be repeated.

The wireless device 200*b* in FIG. 2C incorporates the phase shift circuitry 281 (of FIG. 2B) in a direct conversion architecture, where mmW transmission signals are upconverted and downconverted between baseband and RF without the use of intermediate frequency (IF) signal conversion. For example, the LO signals in the architecture of FIG. 2C may comprise signals at frequencies of tens of GHz.

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

Figure 3:
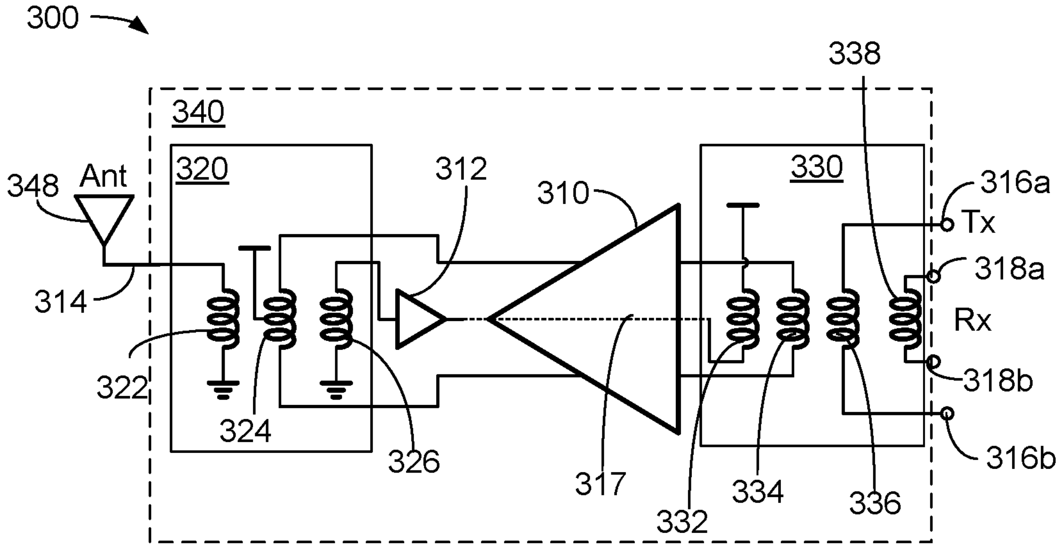
FIG. 3 shows a schematic diagram of a portion of a radio frequency integrated circuit (RFIC) having a transmit (Tx) receive (Rx) (Tx/Rx) circuit.

FIG. 3 shows a schematic diagram of a portion of a radio frequency integrated circuit (RFIC) having a transmit (Tx) receive (Rx) (Tx/Rx) circuit 300. The Tx/Rx circuit 300 includes a power amplifier 310, a low noise amplifier 312, a first electromagnetic (EM) element 320 and a second EM element 330. In an exemplary embodiment, an input of the LNA 312 and an output of the PA 310 may be connected to the first EM element 320. In an exemplary embodiment, an input of the PA 310 and an output of the LNA 312 may be connected to the second EM element 330. The Tx/Rx circuit 300 may be located on an RFIC 340. In an exemplary embodiment, the Tx/Rx circuit 300 may be included in the phase shift circuitry 281 of FIG. 2B or 2C, for example in one or more of the phased array elements 287, which may be implemented on the RFIC 340.

In an exemplary embodiment, the first EM element 320 may comprise a winding 322, a winding 324 and a winding 326. The second EM element 330 may comprise a winding 332, a winding 334, a winding 336 and a winding 338. In an exemplary embodiment, one terminal of the winding 322 and one terminal of the winding 326 are connected to ground and a center tap of the winding 324 is connected to a supply voltage. Similarly, one terminal of the winding 332 may be connected to a supply voltage. However, these connections may have intervening components. For example, the connection of the winding 326 to ground and/or the connection of the winding 322 to ground may include a DC blocking capacitor (not shown).

A transmit signal input to the PA 310 may be provided over nodes 316*a* and 316*b* to the winding 336. In an exemplary embodiment, the transmit signal may be provided by the upconversion mixer 276 of FIG. 2B, for example via one of the phase shifters 283, and may comprise a differential signal. The winding 336 may efficiently electromagnetically couple to the winding 334, which is connected to an input of the PA 310.

In an exemplary embodiment, an input to the LNA 312 may be provided by the winding 326. A receive signal received at the antenna 348 may be provided to the winding 322 over connection 314 and may be efficiently electromagnetically coupled from the winding 322 to the winding 326 for input to the LNA 312. In an exemplary embodiment, the input to the LNA 312 may be a single ended signal and the input to the PA 310 may be a differential signal. In an exemplary embodiment, the output of the LNA 312 may be a single-ended signal or may be a differential signal; and the output of the PA 314 may be a differential signal. In some embodiments, the input to the LNA 312 may be a differential signal. The antenna 348 may be an example of an antenna in the antenna array 248.

An output of the PA 310 may be provided to the winding 324. The winding 324 may efficiently electromagnetically couple to the winding 322 with a first coupling factor to provide a transmit signal to the node 314, which may be connected to the radio frequency (RF) antenna 348.

In an exemplary embodiment, an output of the LNA 312 may be provided to the winding 332. The winding 332 may efficiently electromagnetically couple to the winding 338 with a first coupling factor and provide the receive signal via the winding 338 to the nodes 318*a* and 318*b*. In an exemplary embodiment, the receive signal at the nodes 318*a* and 318*b* may be provided to the downconversion mixer 286 of FIG. 2B or 260 of FIG. 2C, for example via one of the phase shifters 283. In the illustrated example, the second EM element 330 may be coupled to respective phase shifters (not illustrated in FIG. 3) for Tx and Rx, which phase shifters are configured to adjust a phase of a (mmW) Tx or Rx signal, respectively, for beamforming. Other examples, described below, may couple to a common phase shifter for Tx and Rx.

In an exemplary embodiment, the first EM element 320 may be designed such that the winding 322 and the winding 326 efficiently couple, and such that the winding 322 and the winding 324 efficiently couple. In such an architecture, because the winding 322 and the winding 326 efficiently couple, and the winding 322 and the winding 324 efficiently couple, the winding 324 and the winding 326 do not efficiently couple.

Similarly, the second EM element 330 may be designed such that the winding 332 and the winding 338 efficiently couple and such that the winding 334 and the winding 336 efficiently couple. In such an architecture, because the winding 332 and the winding 338 efficiently couple and because the winding 334 and the winding 336 efficiently couple, the winding 332 and the winding 334 do not efficiently couple; the winding 332 and the winding 336 do not efficiently couple; the winding 334 and the winding 338 do not efficiently couple; and the winding 336 and the winding 338 do not efficiently couple.

In an exemplary embodiment, the PA 310 and the LNA 312 have separate and independent operating cores. The dotted line 317 indicates that the output of the LNA 312 is separate from the PA 310. In an exemplary embodiment, the operating cores of the PA 310 and the LNA 312 may be located on an integrated circuit between the first EM element 320 and the second EM element 330 to reduce an overall amount of area consumed by the PA 310, the LNA 312, the first EM element 320 and the second EM element 330. In some examples, a core may refer to transistors configured to amplify a signal. Thus, the PA 310 and 312 may use different transistors to amplify a signal.

Although shown as generally rectangular in shape, the windings 322, 324 and 326 in the first EM element 320 and the windings 332, 334, 336 and 338 in the second EM element 330 may have other shapes and configurations. Further, the illustration in FIG. 3 may not be representative of a layout of the PA 310, the LNA 312, the first EM element 320 and/or the second EM element 330 with respect to each other. For example, the LNA 312 is not necessarily disposed between outputs of the PA 310 and a coupling from the output of the LNA 312 to the second EM element 330 is not necessarily overlapped with the PA 310. Examples that include potential layout details are below.

Figure 4:
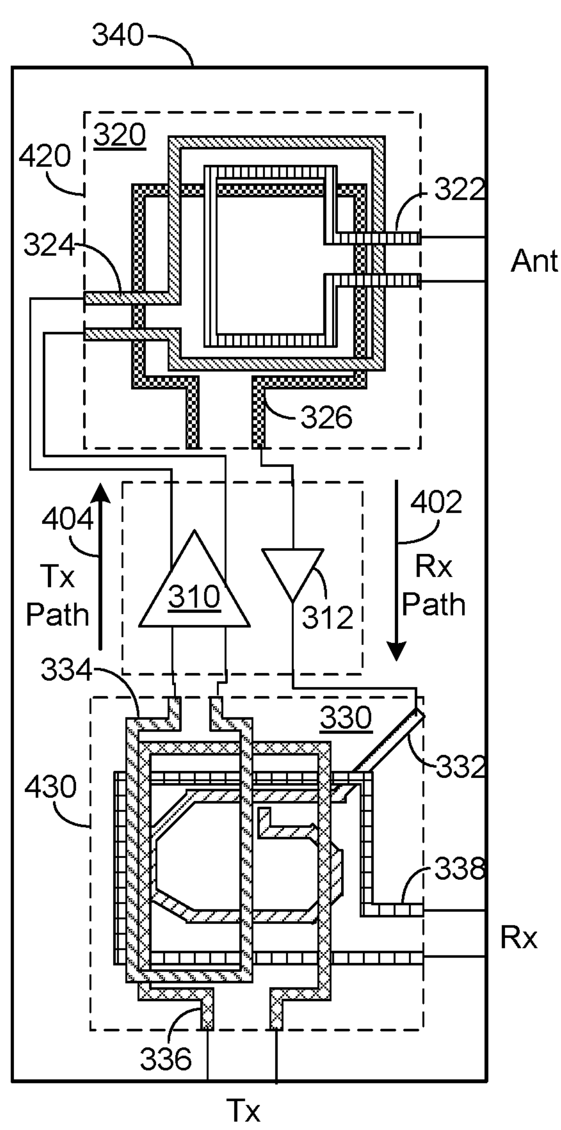
FIG. 4 shows a schematic diagram of the RFIC of FIG. 3 showing an exemplary floorplan of the EM elements, the PA and the LNA.

FIG. 4 shows a schematic diagram 400 of the RFIC 340 of FIG. 3 showing an exemplary floorplan of the EM elements 320 and 330, the PA 310 and the LNA 312. For example, the windings 322, 324 and 326 of the EM element 320 may be interwound and/or occupy a common area on the RFIC 340 shown in the dotted box 420 or at least partially overlap when viewed from a direction orthogonal to one or more layers of the RFIC 340. Similarly, the windings 332, 334, 336 and 338 of the EM element 330 may be interwound and/or occupy a common area on the RFIC 340 shown in the dotted box 430 or at least partially overlap when viewed from a direction orthogonal to one or more layers of the RFIC 340. As can be seen in FIG. 4, certain portions of each of the windings 322-326 may overlap and/or enclose each other, and certain portions of the windings 332-338 may overlap and/or enclose each other. The shape and amount of overlap or enclosure of each of the windings may vary. Each of the windings 322-326 may be disposed on a respective layer of the RFIC 340 or portions of two of more the windings may be implemented on a common layer. Similarly, each of the windings 332-338 may be disposed on a respectively layer of the RFIC 340 or portions of two or more of the windings may be implemented on a common layer. The windings may be substantially square or rectangular, or may have more than four sides (e.g., having an octagonal shape, such as with the winding 332) or may be curvilinear.

The PA 310 and the LNA 312 may be located on the RFIC 340 between the first EM element 320 and the second EM element 330. For example, a majority of the PA 310 and/or LNA 312 may be disposed within theoretical lines drawn between outermost portions of the EM elements 320, 330. In some examples, a component of the PA 310 and/or LNA 312 is overlapped by a theoretical line drawn between any portions of the EM elements 320, 330. As can be seen in FIG. 4, the PA 310 and the LNA 312 may be implemented with separate components and may be laterally spaced from one another, for example such that elements of the PA 310 and LNA 312 do not overlap with one another when viewed from a direction orthogonal to one or more layers of the RFIC 340. As an example, "cores" (e.g., transistors configured to amplify a signal) of the PA 310 and LNA 312 may be separate or otherwise distinct and spaced apart. Thus, in some examples, the first EM element 320, the second EM element 330, the (core of the) PA 310, and the (core of the) LNA 312 may all be located within an area of the RFIC 340 bounded by theoretical lines connecting the outermost portions of the common areas 420, 430.

In an exemplary embodiment, certain windings in the first EM element 320, the LNA 312 and certain windings in the second EM element 330 may form part of a receive path 402. The certain windings in the first EM element 320 (i.e., the windings 322 and 326), the LNA 312, and the certain windings in the second EM element 330 (i.e., windings 332 and 338) that form part of the receive path 402 may be designed to have an efficient coupling factor that is higher than an inefficient coupling factor for windings that do not form part of the receive path 402. Similarly, certain windings in the second EM element 330 (i.e., windings 336 and 334), the PA 310, and certain windings in the first EM element 320 (i.e., windings 324 and 322) may form part of a transmit path 404. The certain windings in the first EM element 320 and the certain windings in the second EM element 330 that form part of the transmit path 404 may be designed to have an efficient coupling factor that is higher than an inefficient coupling factor of windings that do not form part of the transmit path 404.

In an exemplary embodiment, for the receive path 402, the efficient coupling factor for the windings 322 and 326 and the efficient coupling factor for the windings 332 and 338 may be substantially the same or different. That is, the efficient coupling factor for the windings 322 and 326 may be substantially the same or different than the efficient coupling factor for the windings 332 and 338.

In an exemplary embodiment, for the transmit path 404, the efficient coupling factor for the windings 336 and 334 and the efficient coupling factor for the windings 324 and 322 may be the substantially same or different. That is, the efficient coupling factor for the windings 336 and 334 may be substantially the same or different than the efficient coupling factor for the windings 324 and 322. Moreover, the efficient coupling factor for selected windings in the transmit path 404 may be substantially the same or different than the efficient coupling factor for selected windings in the receive path 402. In an exemplary embodiment, the efficient coupling factor may comprise one or more efficient coupling factors.

In an exemplary embodiment, the inefficient coupling factor for the windings 324 and 326 in the first EM element 320, and the inefficient coupling factor for the windings 332 and 334, 332 and 336, 334 and 338, and 336 and 338 in the second EM element 330 may be substantially the same or different. In an exemplary embodiment, the inefficient coupling factor may comprise one or more inefficient coupling factors.

As can be seen in FIG. 4, terminals of the winding 322 may be coupled to an antenna (e.g., the antenna 248 or 348). Both terminals may couple to the antenna (for example, to an antenna configured as a dipole), or one terminal may be coupled to the antenna and the other terminal may be coupled to ground, as illustrated in FIG. 3. Terminals of the winding 324 may be coupled to output(s) of the PA 310. Both terminals may be coupled to PA 310, as illustrated, or one terminal may be grounded when the output of the PA is single ended. Terminals of the winding 326 may be coupled to the input(s) of the LNA 312. Both terminals may couple to the LNA 312 (for example, when inputs to the LNA are differential, not illustrated) or one terminal may be coupled to the LNA 312 and the other terminal may be coupled to ground, as illustrated in FIG. 3.

As can also be seen in FIG. 4, terminals of the winding 332 may be coupled to output(s) of the LNA 312. Both terminals may couple to the LNA 312 (for example, when outputs of the LNA are differential, not illustrated) or one terminal may be coupled to the LNA 312 and the other terminal may be coupled to a supply, as illustrated in FIG. 3. Terminals of the winding 334 may be coupled to input(s) of the PA 310. Both terminals may be coupled to PA 310, as illustrated, or one terminal may be grounded or coupled to a supply or bias when the output of the PA is single ended. Terminals of the winding 336 may be coupled to Tx input(s). Both terminals may be coupled to differential inputs (for example, from a Tx phase shifter 283), as illustrated, or only one terminal may be coupled to a single ended input. While these inputs are illustrated as going to the edge of the RFIC 340, the input(s) may be wholly within the RFIC 340 and received from other components implemented in the RFIC 340. Terminals of the winding 338 may be coupled to Rx output(s). Both terminals may be coupled to differential outputs (for example, to an Rx phase shifter 283), as illustrated, or only one terminal may be coupled to a single ended output. While these outputs are illustrated as going to the edge of the RFIC 340, the output(s) may be wholly within the RFIC 340 and configured to provide signals to other components implemented in the RFIC 340. Center tap connections are not shown in FIG. 4 for simplicity of illustration. Further, degeneration elements (e.g., another inductor/winding) for one or both of the PA 310 and LNA 312 may be implemented, but are not shown.

Figure 5:
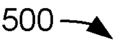
FIG. 5 is a schematic diagram showing an exemplary embodiment of the second EM element of FIG. 3.
Figure 5:
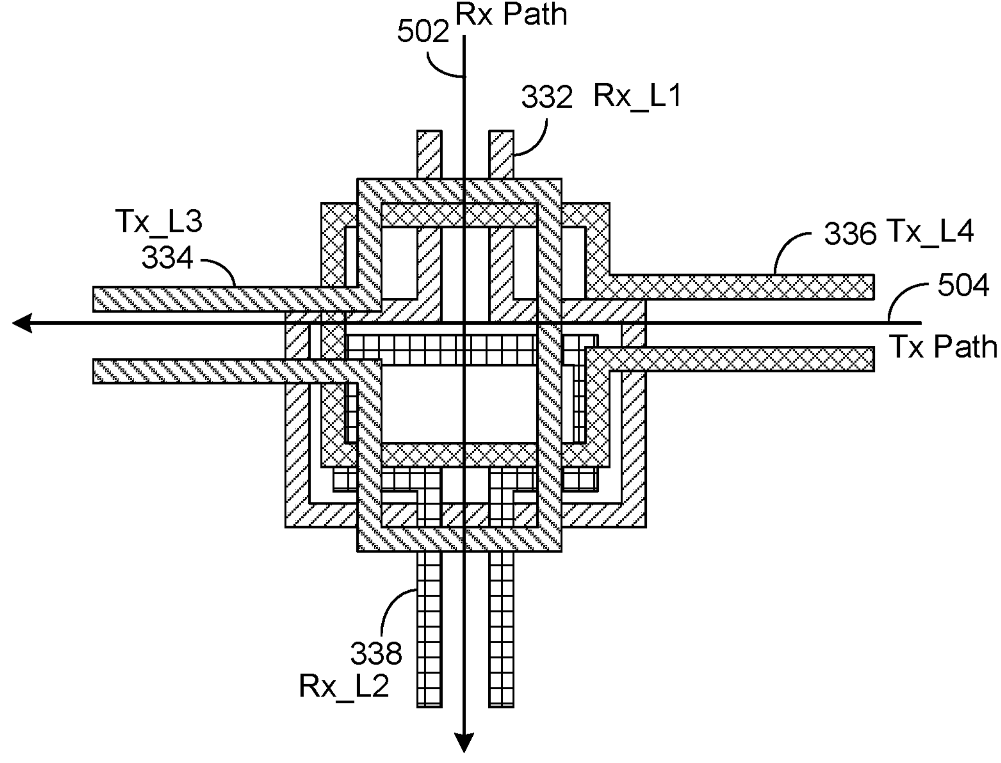

FIG. 5 is a schematic diagram 500 showing an exemplary embodiment of the second EM element 330 of FIG. 3. The second EM element 330 may include the windings 332, 334, 336 and 338, where the winding 332 and the winding 338 comprise part of a receive (Rx) path 502 and the winding 336 and the winding 334 may comprise part of a transmit (Tx) path 504. In an exemplary embodiment, the winding 332 and the winding 338 that comprise the RX path 502 may be designed to have an efficient coupling factor and the winding 336 and the winding 334 that comprise the Tx path 504 may be designed to have an efficient coupling factor. The efficient coupling factor between the winding 332 and the winding 338 may be substantially the same or different than the efficient coupling factor between the winding 336 and the winding 334. The windings 332 and 334, 332 and 336, 334 and 338, and 336 and 338 may be designed to have an inefficient coupling factor. The inefficient coupling factor between the winding 332 and the winding 334, between the winding 332 and the winding 336, between the winding 334 and the winding 338, and between the winding 336 and the winding 338 may be substantially the same or may be different. In an exemplary embodiment, the efficient coupling factor may be higher than the inefficient coupling factor so that a signal in the Rx path 502 does not affect a signal in the Tx path 504, and so that a signal in the Tx path 504 does not affect a signal in the Rx path 502. In the example illustrated in FIG. 5, each of the windings 332-338 is substantially quadrilateral, but each varies in size and shape. Further the terminals of each winding project in a different direction, e.g., such that the angle between each is maximized (so that the terminals for each are arranged approximately 90 degrees apart).

Figure 6:
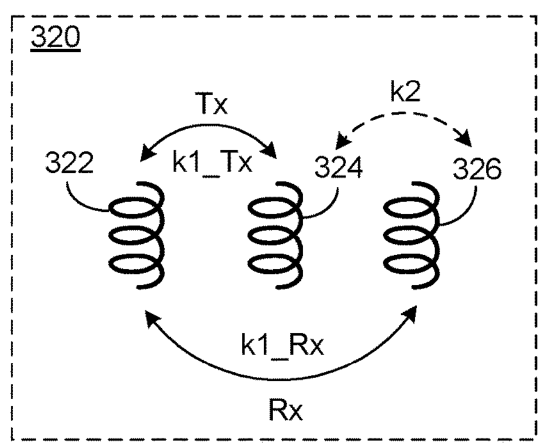
FIG. 6 is a schematic diagram showing electromagnetic coupling of the windings of the first EM element and the second EM element of FIG. 3.
Figure 6:
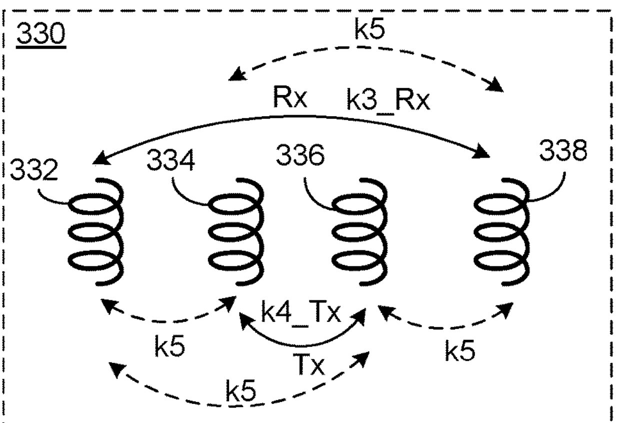

FIG. 6 is a schematic diagram 600 showing exemplary electromagnetic coupling of the windings of the first EM element 320 and the second EM element 330 of FIG. 3. In an exemplary embodiment, the first EM element 320 comprises windings 322 and 324 that may be configured for an efficient (or high) coupling factor in a transmit mode; and comprises windings 322 and 326 that may be configured for an efficient (or high) coupling factor in a receive mode. For example, the windings 322 and 324 may be configured to have an efficient coupling factor of k1_Tx and the windings 322 and 326 may be configured to have an efficient coupling factor of k1_Rx. In exemplary embodiments the coupling factor k1_Tx may be substantially the same or may be different than the coupling factor k1_Rx. As a result of the efficient coupling factor between the winding 322 and the winding 324 (k1_Tx) and the efficient coupling factor between the winding 322 and the winding 326 (k1_Rx), the windings 324 and 326 may have an inefficient coupling factor, k2, in both transmit mode and in receive mode, where k2 is less than k1_Tx and where k2 is less than k1_Rx.

In an exemplary embodiment, the second EM element 330 comprises windings 332 and 338 that may be configured for an efficient coupling factor in a receive mode; and comprises windings 334 and 336 that may be configured for an efficient coupling factor in a transmit mode. For example, the windings 332 and 338 may be configured to have an efficient coupling factor of k3_Rx and the windings 334 and 336 may be configured to have an efficient coupling factor of k4_Tx. In exemplary embodiments the coupling factor k4_Tx may be substantially the same or may be different than the coupling factor k3_Rx. The windings 332 and 334, the windings 332 and 336, the windings 334 and 338, and the windings 336 and 338 may be configured to have an inefficient coupling factor, k5, in both transmit mode and in receive mode, where k5 is less than k4_Tx and where k5 is less than k3_Rx. In some embodiments, the inefficient coupling factor k5 may be substantially the same for one or more of the winding pairs 332 and 334, 332 and 336, 334 and 338, and 336 and 338, or may be different for one or more winding pairs. In some examples, an efficient coupling factor is in the range of 0.2 to 0.9 and an inefficient coupling factor is 0.1 or less. Thus, a value of an efficient coupling factor may be two times or greater (e.g., 3×, 4×, an order of magnitude, etc.) a value of an inefficient coupling factor in some examples.

Figure 7:
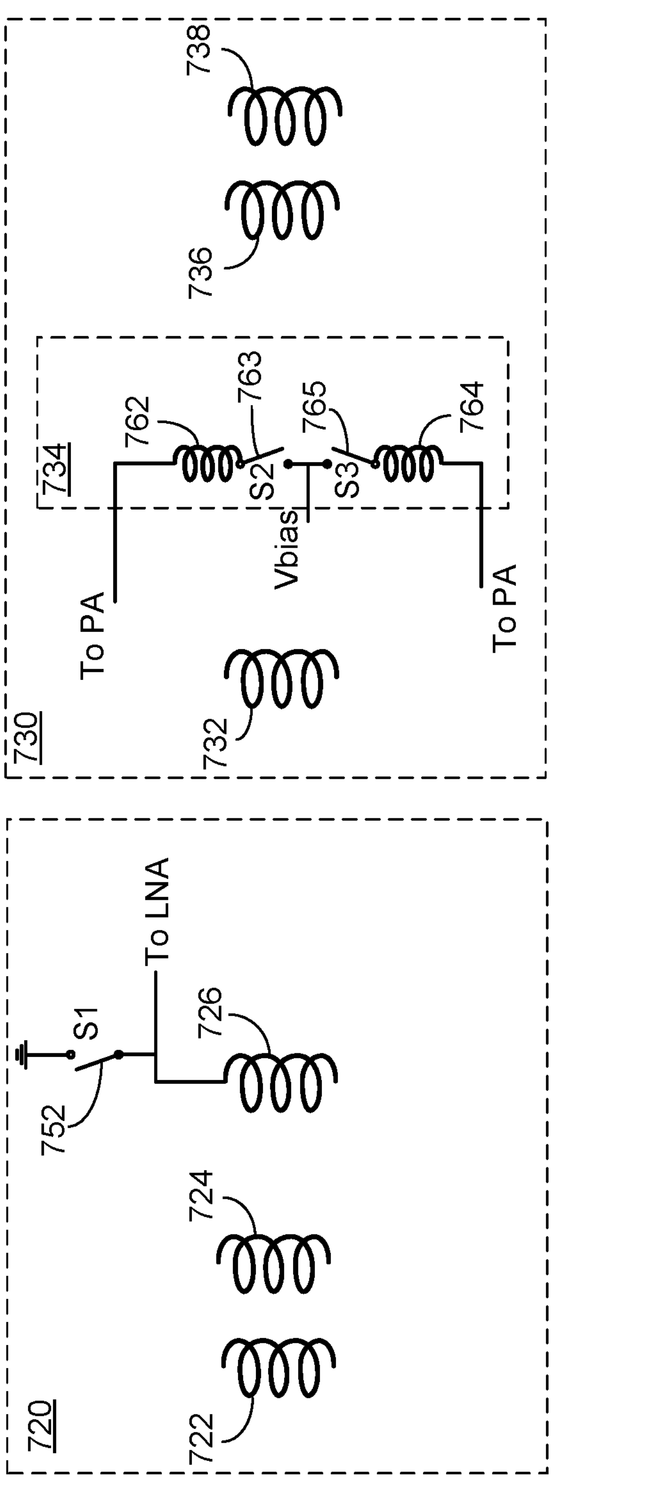
FIG. 7 is a schematic diagram of an alternative exemplary embodiment of the first EM element and second EM element of FIG. 3.

FIG. 7 is a schematic diagram 700 of an alternative exemplary embodiment of the first EM element 320 and second EM element 330 of FIG. 3. In FIG. 7, the first EM element 720 comprises windings 722, 724 and 726 (e.g., corresponding to windings 322, 324, and 326, respectively); and a second EM element 730 comprises windings 732, 734, 736 and 738 (e.g., corresponding to windings 332, 334, 336, and 338, respectively). In an exemplary embodiment, one terminal (or both terminals) of the winding 726 may be connected to an input of the LNA (312, FIG. 3), and may include a switch 752 coupled to ground. In an exemplary embodiment, the switch 752 (S1) may be non-conductive in receive mode and may be conductive in transmit mode.

In an exemplary embodiment, the winding 734 in the second EM element 730 may comprise a first winding 762 and a second winding 764, or a first winding portion 762 and a second winding portion 764. One terminal of the first winding (portion) 762 may be connected to one input of the PA (310, FIG. 3) and another terminal of the first winding (portion) 762 may be connected to a switch 763 (S2). One terminal of the second winding (portion) 764 may be connected to another input of the PA (310, FIG. 3) and another terminal of the second winding (portion) 764 may be connected to a switch 765 (S3). A center tap 766 of the winding 734 may be connected to a bias voltage, Vbias when the switch 763 (S2) and the switch 765 (S3) are conductive.

In an exemplary embodiment, the switch 763 (S2) and the switch 765 (S3) may be non-conductive in receive mode and the switch 763 (S2) and the switch 765 (S3) may be conductive in transmit mode. In an exemplary embodiment, when conductive in transmit mode, the switch 752 (S1) helps to protect the gate of a transistor device that forms the LNA 312 from excessive voltage coming from the large Tx signal along with minimizing the Tx signal leaking back to the second EM element 730 through the off-capacitance of the LNA 312. This helps to improve the stability of the power amplifier 310. When non-conductive in receive mode, the switch 763 (S2) and the switch 765 (S3) help to minimize the receive signal leaking from the second EM element 730 back to the first EM element 720 via the off-capacitance of the power amplifier 310, which otherwise can create potential instability for the LNA 312 in receive mode.

Figure 8:
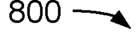
FIG. 8 is a schematic diagram of an alternative exemplary embodiment of the RFIC of FIG. 3.
Figure 8:
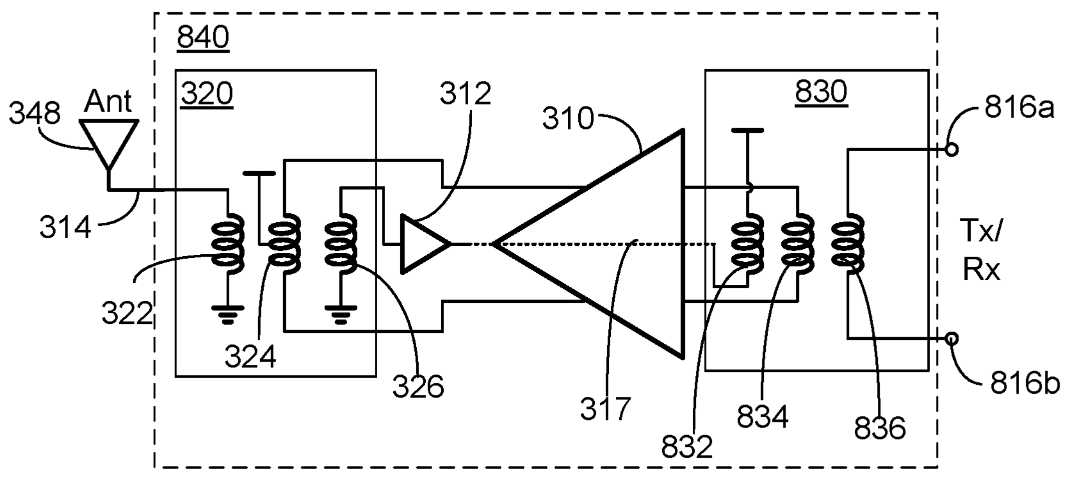

FIG. 8 is a schematic diagram 800 of an alternative exemplary embodiment of the RFIC 340 of FIG. 3. In an exemplary embodiment, an RFIC 840 may comprise the first EM element 320, the LNA 312, the PA 310 and a second EM element 830. The second EM element 830 may comprise windings 832, 834 and 836. In an exemplary embodiment, the winding 836 may be used for both transmit signals and receive signals where the winding 338 of FIG. 3 is omitted. In this exemplary embodiment, the windings 832, 834 and 836 may be designed such that in a receive mode there is an efficient coupling factor between the winding 832 and the winding 836, and in a transmit mode, there is an efficient coupling factor between the winding 836 and the winding 834. In this exemplary embodiment, there is an inefficient coupling factor between the winding 832 and the winding 834. In such examples, the terminals 816*a* and 816*b* may be coupled to a differential phase shifter (e.g., phase shifter 283) that is shared or common for Tx and Rx, for example a bidirectional phase shifter. Single ended Tx and Rx signals may be used instead.

Figure 9:
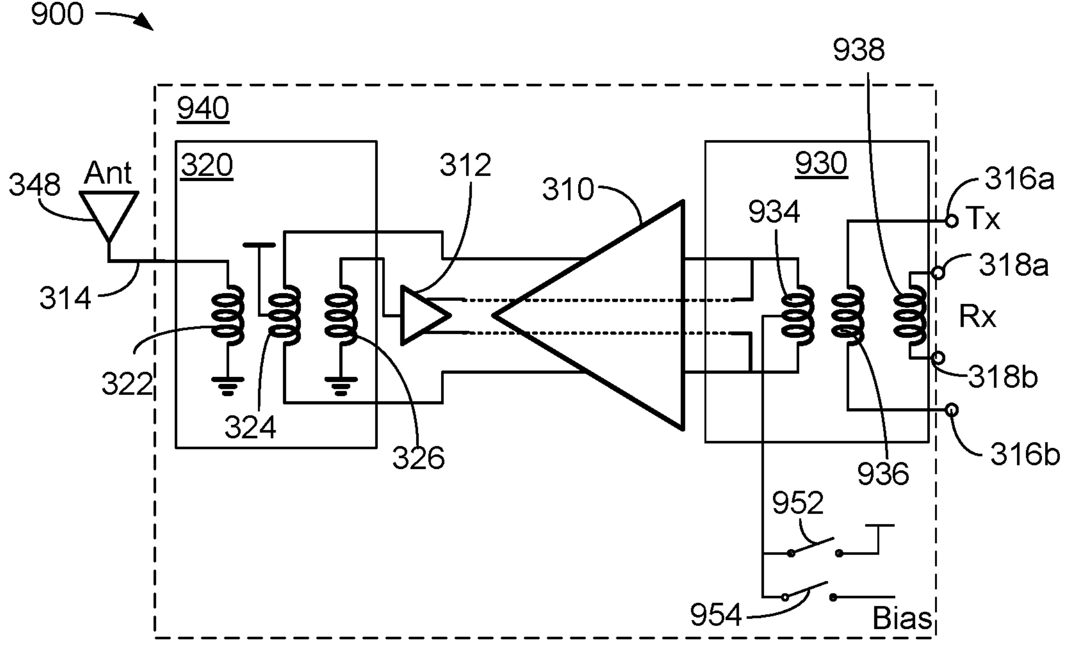
FIG. 9 is a schematic diagram of an alternative exemplary embodiment of the RFIC of FIG. 3.

FIG. 9 is a schematic diagram 900 of an alternative exemplary embodiment of the RFIC 340 of FIG. 3. In an exemplary embodiment, an RFIC 940 may comprise the first EM element 320, the LNA 312, the PA 310 and a second EM element 930. The second EM element 930 may comprise windings 934, 936 and 938.

In this exemplary embodiment, the windings 934, 936 and 938 may be designed such that in a receive mode there is an efficient coupling factor between the winding 934 and the winding 938, and in a transmit mode, there is an efficient coupling factor between the winding 936 and the winding 934. In this exemplary embodiment, there is an inefficient coupling factor between the winding 936 and the winding 938. In this exemplary embodiment, the winding 332 of FIG. 3 is omitted.

In an exemplary embodiment, the LNA 312 may be configured to receive a single-ended input from the winding 326 as shown in FIG. 9. In other embodiments, the LNA 312 may receive a differential input from the winding 326. In an exemplary embodiment, the LNA 312 may be configured to provide a differential output and the winding 934 may have a center tap that is connected to switches 952 and 954. For example, in a receive mode, the switch 952 may be conductive to connect the center tap of the winding 934 to a system voltage, VDD, and the switch 954 may be non-conductive. In a transmit mode, the switch 954 may be conductive to connect the center tap of the winding 934 to a bias voltage, Vbias, and the switch 952 may be non-conductive. In other examples, one of the windings 936, 938 is omitted and a common Tx and Rx interface is used (e.g., similar to FIG. 8).

Figure 10:
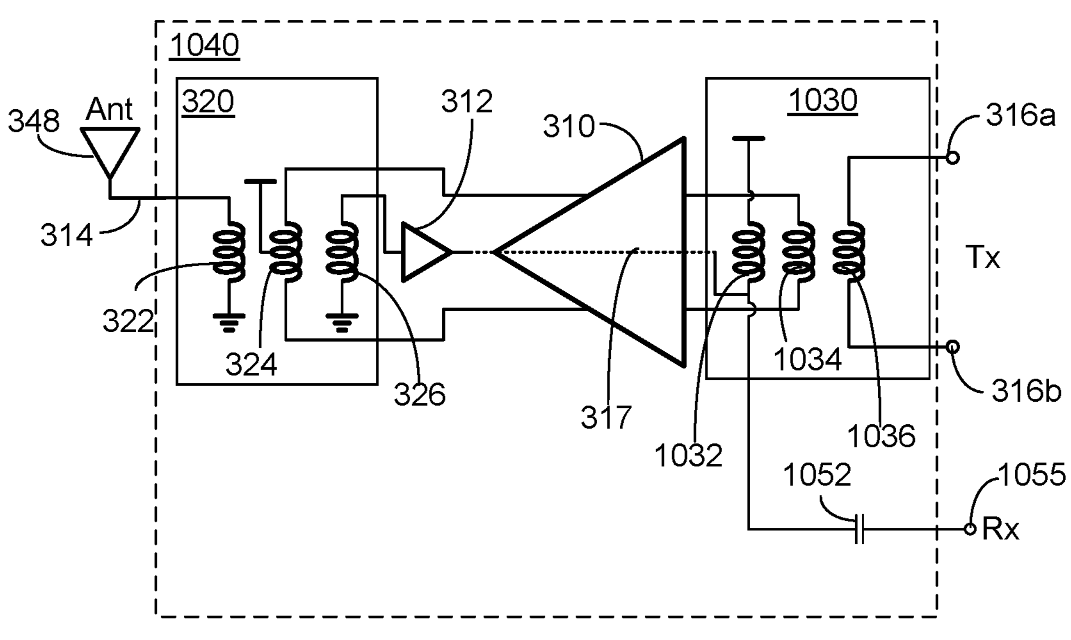
FIG. 10 is a schematic diagram of an alternative exemplary embodiment of the RFIC of FIG. 3.

FIG. 10 is a schematic diagram 1000 of an alternative exemplary embodiment of the RFIC 340 of FIG. 3. In an exemplary embodiment, an RFIC 1040 may comprise the first EM element 320, the LNA 312, the PA 310 and a second EM element 1030. The second EM element 1030 may comprise windings 1032, 1034 and 1036.

In this exemplary embodiment, the windings 1032, 1034 and 1036 may be designed such that in a receive mode the receive signal is provided directly from the winding 1032 through a capacitance 1052 to a receive node 1055. In a transmit mode, there is an efficient coupling factor between the winding 1036 and the winding 1034. In this exemplary embodiment, there is an inefficient coupling factor between the winding 1032 and the winding 1034, and an inefficient coupling factor between the winding 1032 and the winding 1036. In this exemplary embodiment, the winding 338 of FIG. 3 is omitted.

Figure 11:
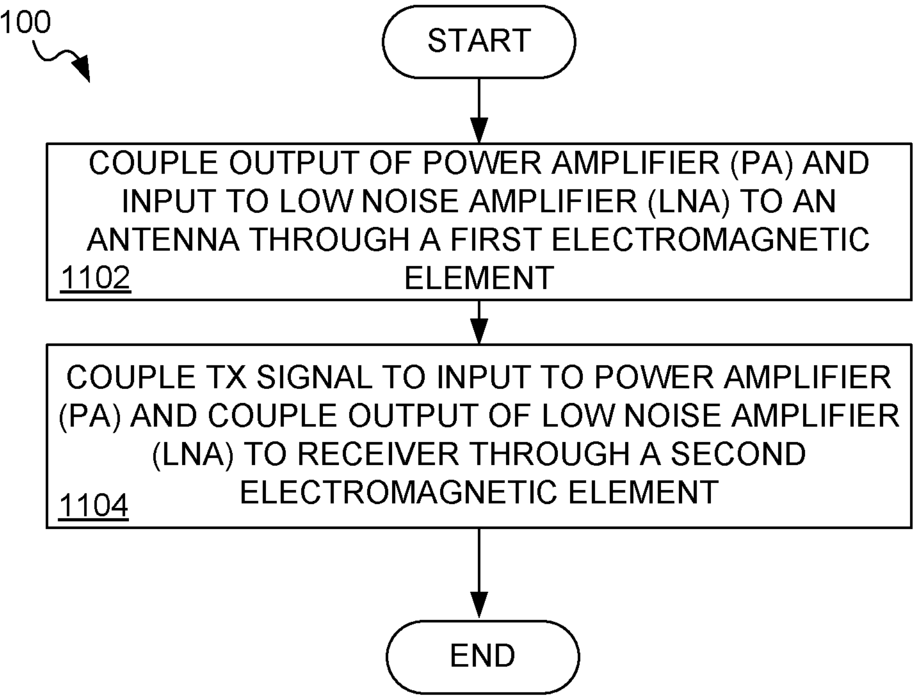
FIG. 11 is a flow chart describing an example of the operation of a method for signal amplification.

FIG. 11 is a flow chart 1100 describing an example of the operation of a method for signal amplification. The blocks in the method 1100 can be performed in or out of the order shown, and in some embodiments, can be performed at least in part in parallel.

In block 1102, an output of a power amplifier (PA) and an input to a low noise amplifier (LNA) are coupled to an antenna through a first electromagnetic (EM) element. For example, the output of the PA 310 and the input to the LNA 312 are both coupled to an antenna 348 through the first EM element 320. The system may comprise a TDD system, and thus this operation may not be concurrent.

In block 1104, a transmit signal is coupled to an input to a power amplifier (PA) and an output of a low noise amplifier (LNA) is coupled to a receiver through a second electromagnetic (EM) element. For example, the transmit signal input to the PA 310 and the output of the LNA 312 are both coupled to the second EM element 330. The system may comprise a TDD system, and thus this operation may not be concurrent.

The first EM element is implemented using a first plurality of windings occupying a first common area and the second EM element is implemented using a second plurality of windings occupying a second common area. For example, the first EM element 320 is implemented using windings 322, 324 and 326 in a common area 420 and the second EM element 330 is implemented using windings 332, 334, 336 and 338 in a common area 430. One or more of the windings in the first EM element 320 and/or one or more of the windings in the second EM element 330 may be shared between Tx and Rx operations.

Figure 12:
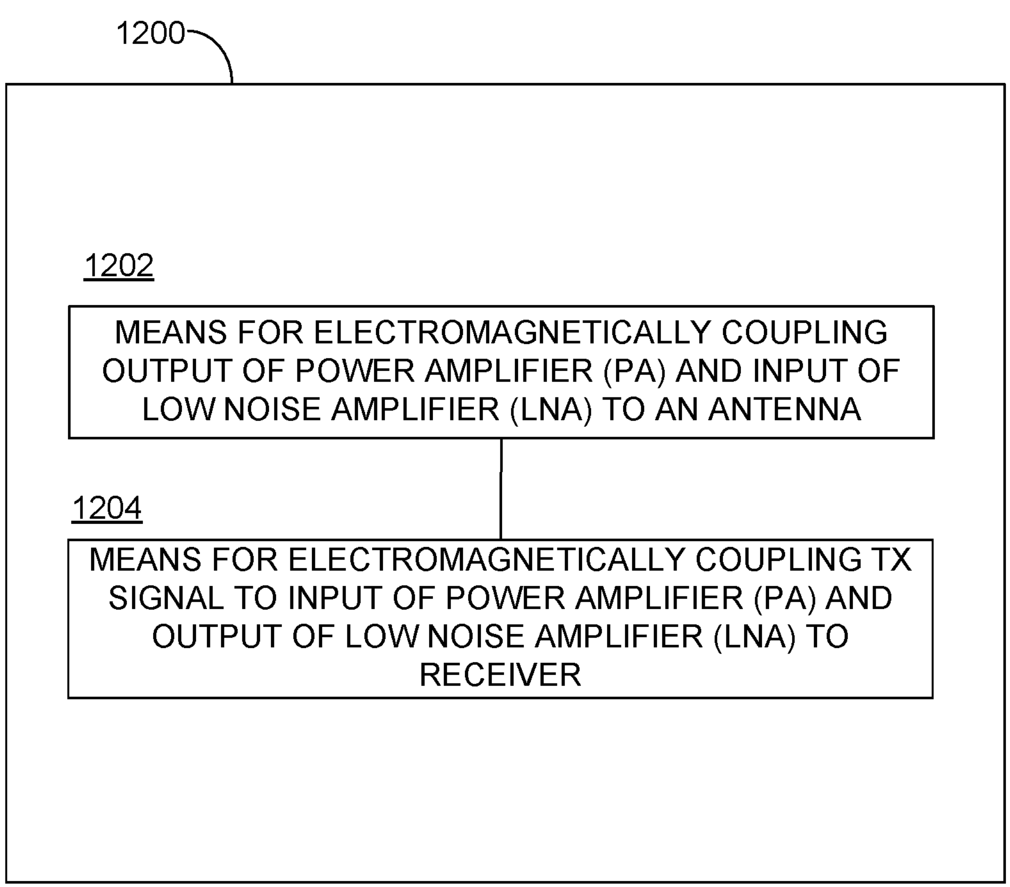
FIG. 12 is a functional block diagram of an apparatus for signal amplification.

FIG. 12 is a functional block diagram of an apparatus 1200 for signal amplification. The apparatus 1200 comprises means 1202 for electromagnetically coupling an output of a power amplifier (PA) and an input of a low noise amplifier (LNA) to an antenna. In certain embodiments, the means 1202 for electromagnetically coupling an output of a power amplifier (PA) and an input of a low noise amplifier (LNA) to an antenna can be configured to perform one or more of the functions described in operation block 1102 of method 1100 (FIG. 11). In an exemplary embodiment, the means 1202 for electromagnetically coupling an output of a power amplifier (PA) and an input of a low noise amplifier (LNA) to an antenna may comprise the first EM element 320.

The apparatus 1200 also comprises means 1204 for electromagnetically coupling a transmit signal to an input of a power amplifier (PA) and an output of a low noise amplifier (LNA) to a receiver. In certain embodiments, the means 1204 for electromagnetically coupling a transmit signal to an input of a power amplifier (PA) and an output of a low noise amplifier (LNA) to a receiver can be configured to perform one or more of the functions described in operation block 1104 of method 1100 (FIG. 11). In an exemplary embodiment, the means 1204 for electromagnetically coupling a transmit signal to an input of a power amplifier (PA) and an output of a low noise amplifier (LNA) to a receiver may comprise the second EM element 330.

The means 1202 may be implemented using a first plurality of windings in a first common area and the means 1204 may be implemented using a second plurality of windings in a second common area. One or more of the windings in the means 1202 and/or one or more of the windings in the means 1204 may be shared between Tx and Rx operations.

Implementation examples are described in the following numbered clauses:

1. A radio frequency integrated circuit (RFIC), comprising: a power amplifier (PA) having an output coupled to an antenna through a first electromagnetic (EM) element, the PA configured to receive at an input a transmit signal from a second EM element; a low noise amplifier (LNA) having an input coupled to the first EM element and an output coupled to the second EM element, the power amplifier and the LNA comprising separate amplifier cores; and wherein the first EM element comprises a first plurality of windings occupying a first common area and the second EM element comprises a second plurality of windings occupying a second common area.

2. The RFIC of clause 1, wherein at least one winding of the first and second EM elements is shared between the PA and the LNA.

3. The RFIC of any of clauses 1 through 2, wherein a first portion of the first plurality of windings in the first EM element have an efficient coupling factor and a second portion of the first plurality of windings in the first EM element have an inefficient coupling factor, where the efficient coupling factor is greater than the inefficient coupling factor.

4. The RFIC of clause 3, wherein the first portion of the first plurality of windings in the first EM element that have an efficient coupling factor comprise first windings having a first receive coupling factor (k1_Rx) and comprise second windings having a first transmit coupling factor (k1_Tx).

5. The RFIC of clause 4, wherein the first receive coupling factor (k1_Rx) is substantially the same as the first transmit coupling factor (k1_Tx).

6. The RFIC of clause 4, wherein the first receive coupling factor (k1_Rx) is different than the first transmit coupling factor (k1_Tx).

7. The RFIC of any of clauses 1 through 6, wherein a first portion of the second plurality of windings in the second EM element have an efficient coupling factor and a second portion of the second plurality of windings in the second EM element have an inefficient coupling factor, where the efficient coupling factor is greater than the inefficient coupling factor.

8. The RFIC of any of clauses 1 through 7, wherein the first portion of the second plurality of windings in the second EM element having the efficient coupling factor comprise first windings having a second receive coupling factor (k3_Rx) and comprise second windings having a second transmit coupling factor (k4_Tx).

9. The RFIC of clause 8, wherein the second receive coupling factor (k3_Rx) is substantially the same as the second transmit coupling factor (k4_Tx).

10. The RFIC of clause 8, wherein the second receive coupling factor (k3_Rx) is different than the second transmit coupling factor (k4_Tx).

11. The RFIC of any of clauses 1 through 10, wherein the output of the LNA is a single-ended signal.

12. The RFIC of any of clauses 1 through 11, wherein the second EM element is coupled to a signal upconverter and a signal downconverter.

13. The RFIC of any of clauses 1 through 12, wherein the second EM element comprises a first winding connected to the power amplifier, the first winding comprising a first winding portion and a first switch, a second winding portion and a second switch, the first switch and the second switch connected to a bias voltage source.

14. A method for amplifying signals, comprising: coupling an output of a power amplifier (PA) and an input of a low noise amplifier (LNA) to an antenna through a first electromagnetic (EM) element; and coupling an input of the PA to a transmit signal and an output of the LNA to a receiver through a second EM element, wherein the first EM element comprises a first plurality of windings occupying a first common area and the second EM element comprises a second plurality of windings occupying a second common area.

15. The method of clause 14, further comprising sharing at least one winding of the first and second EM elements between the PA and the LNA.

16. The method of any of clauses 14 through 15, further comprising: coupling a first portion of the first plurality of windings in the first EM element with an efficient coupling factor; and coupling a second portion of the first plurality of windings in the first EM element with an inefficient coupling factor, where the efficient coupling factor is greater than the inefficient coupling factor.

17. The method of any of clauses 14 through 16, wherein the output of the LNA is a differential signal.

18. The method of any of clauses 14 through 17, further comprising: coupling a signal from the first EM element to the antenna; and coupling signals from the second EM element to a signal upconverter and a signal downconverter.

19. A device for amplifying signals, comprising: means for coupling an output of a power amplifier (PA) and an input of a low noise amplifier (LNA) to an antenna through a first electromagnetic (EM) element; and means for coupling an input of the PA to a transmit signal and an output of the LNA to a receiver through a second EM element; and wherein the first EM element comprises a first plurality of windings occupying a first common area and the second EM element comprises a second plurality of windings occupying a second common area.

20. The device of clause 19, further comprising sharing at least one winding of the first and second EM elements between the PA and the LNA.

21. The device of any of clauses 19 through 20, further comprising: means for coupling a first portion of the first plurality of windings in the first EM element with an efficient coupling factor; and means for coupling a second portion of the first plurality of windings in the first EM element with an inefficient coupling factor, where the efficient coupling factor is greater than the inefficient coupling factor.

22. The device of any of clauses 19 through 21, wherein an output of the LNA is a single-ended signal.

23. The device of any of clauses 19 through 22, further comprising: means for coupling the first EM element to the antenna; and means for coupling the second EM element to a signal upconverter and a signal downconverter.

24. A communication system having a pseudo bi-directional amplifier, comprising: a first electromagnetic (EM) element; a second EM element; and a power amplifier (PA) and a low noise amplifier (LNA) each disposed at least partially between the first EM element and the second EM element, the PA being spaced from the LNA, wherein the PA is coupled to an antenna through the first EM element and is configured to receive a transmit signal from the second EM element, wherein an input of the LNA is coupled to the first EM element and an output of the LNA is coupled to the second EM element, and wherein the first EM element comprises a first plurality of at least partially overlapping windings and the second EM element comprises a second plurality of at least partially overlapping windings.

25. The system of clause 24, wherein the second EM element is coupled to a receive phase shifter and a transmit phase shifter.

26. The system of any of clauses 24 through 25, wherein the second EM element is coupled to a phase shifter configured for both receive and transmit operations.

27. The system of any of clauses 24 through 26, wherein a first winding of the second plurality of at least partially overlapping windings is selectively coupled to a system voltage and selectively coupled to a bias voltage.

28. The system of any of clauses 24 through 27, wherein a first winding of the second plurality of at least partially overlapping windings is coupled to a single ended receive node through a capacitor.

29. The system of any of clauses 24 through 28, wherein a center tap of a first winding of the second plurality of at least partially overlapping windings is selectively coupled to a bias voltage.

30. The system of any of clauses 24 through 29, wherein the input of the LNA is further selectively coupled to ground.

31. A communication system, comprising: a pseudo bi-directional amplifier, including a transmitter and a receiver, a power amplifier connected to an antenna through a first electromagnetic (EM) element, the PA configured to receive a transmit signal from a second EM element, a low noise amplifier (LNA) connected to the first EM element and the second EM element, the power amplifier and the LNA comprising separate amplifier cores, and wherein the first EM element comprises a first plurality of interwound windings having a first efficient coupling factor and occupying a first common area and the second EM element comprises a second plurality of interwound windings having a second efficient coupling factor and occupying a second common area.

32. The RFIC of clause 1, wherein the second EM element is coupled to a receive phase shifter and a transmit phase shifter.

33. The RFIC of clause 1, wherein the second EM element is coupled to a phase shifter configured for both receive and transmit operations.

34. The RFIC of clause 1, wherein a first winding of the second plurality of windings is selectively coupled to a system voltage and selectively coupled to a bias voltage.

35. The RFIC of clause 1, wherein a first winding of the second plurality of windings is coupled to a single ended receive node through a capacitor.

36. The RFIC of clause 1, wherein a center tap of a first winding of the second plurality of windings is selectively coupled to a bias voltage.

37. The RFIC of clause 1, wherein the input of the LNA is further selectively coupled to ground.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A radio frequency integrated circuit (RFIC), comprising:

a power amplifier (PA) having an output coupled to an antenna through a first electromagnetic (EM) element, the PA configured to receive at an input a transmit signal from a second EM element;

a low noise amplifier (LNA) having an input coupled to the first EM element and an output coupled to the second EM element, the power amplifier and the LNA comprising separate amplifier cores; and wherein the first EM element comprises a first plurality of windings occupying a first common area and the second EM element comprises a second plurality of windings occupying a second common area, at least one of the first plurality of windings in the first EM element is coupled to an input of the LNA and selectively coupled to a system ground and wherein at least one of the second plurality of windings in the second EM element comprises a first winding portion and a first switch, and a second winding portion and a second switch each of the first winding portion and the second winding portion selectively coupled to a bias voltage by the first switch and the second switch.

2. The RFIC of claim 1, wherein at least one winding of the first and second EM elements is shared between the PA and the LNA.

3. The RFIC of claim 1, wherein a first portion of the first plurality of windings in the first EM element have a first coupling factor and a second portion of the first plurality of windings in the first EM element have a second coupling factor, where the first coupling factor is greater than the second coupling factor.

4. The RFIC of claim 3, wherein the first portion of the first plurality of windings in the first EM element that have the first coupling factor comprise first windings having a first receive coupling factor (k1_Rx) and comprise second windings having a first transmit coupling factor (k1_Tx).

5. The RFIC of claim 4, wherein the first receive coupling factor (k1_Rx) is substantially the same as the first transmit coupling factor (k1_Tx).

6. The RFIC of claim 4, wherein the first receive coupling factor (k1_Rx) is different than the first transmit coupling factor (k1_Tx).

7. The RFIC of claim 1, wherein a first portion of the second plurality of windings in the second EM element have a first coupling factor and a second portion of the second plurality of windings in the second EM element have a second coupling factor, where the first coupling factor is greater than the second coupling factor.

8. The RFIC of claim 7, wherein the first portion of the second plurality of windings in the second EM element having the first coupling factor comprise first windings having a second receive coupling factor (k3_Rx) and comprise second windings having a second transmit coupling factor (k4_Tx).

9. The RFIC of claim 8, wherein the second receive coupling factor (k3_Rx) is substantially the same as the second transmit coupling factor (k4_Tx).

10. The RFIC of claim 8, wherein the second receive coupling factor (k3_Rx) is different than the second transmit coupling factor (k4_Tx).

11. The RFIC of claim 1, wherein the output of the LNA is a single-ended signal.

12. The RFIC of claim 1, wherein the second EM element is coupled to a signal upconverter and a signal downconverter.

13. A method for amplifying signals, comprising:

coupling an output of a power amplifier (PA) and an input of a low noise amplifier (LNA) to an antenna through a first electromagnetic (EM) element; and coupling an input of the PA to a transmit signal and an output of the LNA to a receiver through a second EM element, wherein the first EM element comprises a first plurality of windings occupying a first common area and the second EM element comprises a second plurality of windings occupying a second common area, at least one of the first plurality of windings in the first EM element is coupled to an input of the LNA and selectively coupled to a system ground and wherein at least one of the second plurality of windings in the second EM element comprises a first winding portion and a first switch, and a second winding portion and a second switch each of the first winding portion and the second winding portion selectively coupled to a bias voltage by the first switch and the second switch.

14. The method of claim 13, further comprising sharing at least one winding of the first and second EM elements between the PA and the LNA.

15. The method of claim 13, further comprising:

coupling a first portion of the first plurality of windings in the first EM element with a first coupling factor; and coupling a second portion of the first plurality of windings in the first EM element with a second coupling factor, where the first coupling factor is greater than the second coupling factor.

16. The method of claim 13, wherein the output of the LNA is a differential signal.

17. The method of claim 13, further comprising:

coupling a signal from the first EM element to the antenna; and coupling signals from the second EM element to a signal upconverter and a signal downconverter.

18. A device for amplifying signals, comprising:

means for coupling an output of a power amplifier (PA) and an input of a low noise amplifier (LNA) to an antenna through a first electromagnetic (EM) element; and means for coupling an input of the PA to a transmit signal and an output of the LNA to a receiver through a second EM element; and wherein the first EM element comprises a first plurality of windings occupying a first common area and the second EM element comprises a second plurality of windings occupying a second common area, at least one of the first plurality of windings in the first EM element is coupled to an input of the LNA and selectively coupled to a system ground and wherein at least one of the second plurality of windings in the second EM element comprises a first winding portion and a first switch, and a second winding portion and a second switch each of the first winding portion and the second winding portion selectively coupled to a bias voltage by the first switch and the second switch.

19. The device of claim 18, further comprising sharing at least one winding of the first and second EM elements between the PA and the LNA.

20. The device of claim 18, further comprising:

means for coupling a first portion of the first plurality of windings in the first EM element with a first coupling factor; and means for coupling a second portion of the first plurality of windings in the first EM element with a second coupling factor, where the first coupling factor is greater than the second coupling factor.

21. The device of claim 18, wherein an output of the LNA is a single-ended signal.

22. The device of claim 18, further comprising:

means for coupling the first EM element to the antenna; and means for coupling the second EM element to a signal upconverter and a signal downconverter.

23. A communication system having a pseudo bi-directional amplifier, comprising:

a first electromagnetic (EM) element;

a second EM element; and a power amplifier (PA) and a low noise amplifier (LNA) each disposed at least partially between the first EM element and the second EM element, the PA being spaced from the LNA, wherein the PA is coupled to an antenna through the first EM element and is configured to receive a transmit signal from the second EM element, wherein an input of the LNA is coupled to the first EM element and an output of the LNA is coupled to the second EM element, and wherein the first EM element comprises a first plurality of at least partially overlapping windings and the second EM element comprises a second plurality of at least partially overlapping windings, at least one of the first plurality of at least partially overlapping windings in the first EM element is coupled to an input of the LNA and selectively coupled to a system ground and wherein at least one of the second plurality of at least partially overlapping windings in the second EM element comprises a first winding portion and a first switch, and a second winding portion and a second switch each of the first winding portion and the second winding portion selectively coupled to a bias voltage by the first switch and the second switch.

24. The system of claim 23, wherein the second EM element is coupled to a receive phase shifter and a transmit phase shifter.

25. The system of claim 23, wherein the second EM element is coupled to a phase shifter configured for both receive and transmit operations.

* * * * *